United States Patent [19]

Klein et al.

[11] Patent Number: 4,829,024

[45] Date of Patent: May 9, 1989

[54] METHOD OF FORMING LAYERED POLYSILICON FILLED CONTACT BY DOPING SENSITIVE ENDPOINT ETCHING

[75] Inventors: Jeffrey L. Klein; Stephen S. Poon; Mark S. Swenson; Sudhir K. Madan, all of Austin, Tex.

[73] Assignee: Motorola, Inc., Schaumburg, Ill.

[21] Appl. No.: 239,919

[22] Filed: Sep. 2, 1988

[51] Int. Cl.[4] .......................................... H01L 21/285
[52] U.S. Cl. .................................. 437/189; 437/192; 437/193; 357/71
[58] Field of Search ...................... 437/189, 192, 193; 148/DIG. 19; 357/51, 71, 59 F, 68

[56] References Cited

U.S. PATENT DOCUMENTS

| 4,146,902 | 3/1979 | Tanimoto et al. | 357/59 F |
| 4,364,166 | 12/1982 | Crowder et al. | 437/193 |
| 4,424,578 | 1/1984 | Miyamoto | 357/51 |

FOREIGN PATENT DOCUMENTS

| 0156837 | 7/1986 | Japan | 437/193 |
| 0216322 | 9/1986 | Japan | 437/192 |
| 0198764 | 9/1986 | Japan | 437/193 |
| 0222125 | 10/1986 | Japan | 437/193 |

Primary Examiner—Brian E. Hearn
Assistant Examiner—Tuan Nguyen
Attorney, Agent, or Firm—Robert L. King

[57] ABSTRACT

A semiconductor process is provided for the formation of a very low resistance contact. After a straight wall contact is formed conventionally above a silicon substrate, a blanket metal barrier layer is deposited. A plurality of planar polysilicon layers are deposited above the metal barrier layer. The polysilicon layers have varying doping levels and are etched away. A by-product gas of the etch reaction is monitored and the transition between polysilicon layers can be accurately noted. In this way, a layer of doped polysilicon is left above the metal barrier in the contact region. Metal may then be patterned over the entire structure to provide a low resistance reliable contact.

10 Claims, 3 Drawing Sheets

METHOD OF FORMING LAYERED POLYSILICON FILLED CONTACT BY DOPING SENSITIVE ENDPOINT ETCHING

CROSS REFERENCE TO RELATED APPLICATION

Application Ser. No. SC-00427A, entitled "An LLD Transistor Process Having Doping Sensitive Endpoint Etching", filed simultaneously herewith by Stephen Poon et al..

FIELD OF THE INVENTION

This invention relates generally to the field of electronic circuit fabrication techniques, and more particularly, to manufacturing low resistance contacts in integrated semiconductor circuits.

BACKGROUND OF THE INVENTION

In very large scale integrated circuits (VLSIC), electrical contact between aluminum interconnections and monocrystalline or polycrystalline regions below the aluminum is typically established by etching contact windows in a dielectric material such as silicon dioxide. A blanket film of aluminum, which may be doped with small amounts of copper and/or silicon, is deposited on a top surface of the dielectric and in the contact windows by some form of physical vapor deposition such as RF sputtering or evaporation. The aluminum is then patterned by photolithographic and subtractive etching techniques.

As packing densities of integrated circuit devices increase, the size of electrical contact windows must be decreased. However, it is usually not possible to proportionally scale down the thickness of the dielectric. As the ratio of the sidewall area of a contact and the top surface area of the contact increases, the step coverage of physically deposited metal, such as aluminum, is degraded. As a result, the current handling capacity of aluminum in the contact is reduced which compromises its reliability and integrity.

A common technique to improve the fill of small, deep contacts is to deposit an electrically conductive film by chemical vapor deposition. Several materials such as tungsten, molybdenum, and aluminum have been suggested for this purpose. However, the best established material is polycrystalline silicon or polysilicon. Polysilicon is easily deposited highly conformal and adheres well to most other materials. Polysilicon is also easily etched into fine-line patterns.

There are two noteable disadvantages of polysilicon as an interconnection for VLSIC. Polysilicon is not electrically conductive and must be doped with n-type (e.g. arsenic, phosphorus, antimony) or p-type (e.g. boron, aluminum, indium) materials to become electrically conductive. Even when heavily doped, polysilicon still must be layered with a more conductive materials such as aluminum to be a satisfactory interconnection. However, the combination of a polysilicon layer and an aluminum layer results in interconnection which is far too thick to pattern and etch properly into fine-line patterns. Therefore, it is necessary to thin down the polysilicon prior to aluminum deposition by the use of a blanket etchback.

Other problems also exist in the fabrication of polysilicon-filled contacts described above. Unless additional masking layers are used to selectively dope the polysilicon both n− and p−type, low resistance contacts to both n- and p-type silicon devices may not be formed. Widmann et al. in U.S. Pat. No. 4,562,640 entitled "Method Of Manufacturing Stable, Low Resistance Contacts in Integrated Semiconductor Circuits" suggests forming a metallic film such as a metal silicide layer between a substrate or diffusion and a polysilicon-filled contact. However, good electrical contact between the polysilicon and metal silicide is is not guaranteed. Upon insertion into a conventional polysilicon hot-wall reactor at temperatures at or above five hundred eighty degrees Centigrade, most metal silicide and pure metal layers will form a nonconductive native oxide which can ruin the electrical contact to the polysilicon layer. A more appropriate metal layer of titanium nitride, TiN, is suggested by Moghadam et al. in an article entitled "Polysilicon-Filled Contact Planarization" presented at the 1988 *Proceedings Fifth International IEEE VLSI Multilevel Interconnection Conference*, pages 345–352, June 13, 1988. Another problem associated with polysilicon-filled contacts involves the etchback of the polysilicon layer. If the polysilicon is etched completely so that the dielectric is exposed during the etch, the sudden excess of reactive etchant species will greatly accelerate the etch rate of the polysilicon remaining in the contact windows, thereby gouging the filled contacts.

BRIEF DESCRIPTION OF THE INVENTION

Accordingly, it is an object of the present invention to provide an improved layered polysilicon contact.

It is another object of the present invention to provide an improved process for forming low resistance contacts in very large scale integration semiconductor electronic circuits.

Yet another object of the present invention is to provide an improved method for forming low resistance contacts in very large scale integration semiconductor electronic circuits.

A further object of the present invention is to provide an improved layered polysilicon interconnect for holes having vertical sidewalls.

In carrying out these and other objects of the invention, there is provided, in one form, a process for forming a polysilicon semiconductor contact. A silicon substrate material is provided in which there is a heavily doped diffusion region and upon which layer of an electrically insulating material is provided. A contact fill region is then formed by removing a portion of the insulating material to expose a portion of a top surface of the doped diffusion region. A layer of a refractory metal is deposited over both the layer of electrically insulating material and the contact fill region. A layer of a metal barrier is deposited over the layer of refractory metal. A first layer of polysilicon is deposited above the layer of metal barrier material. The first layer of polysilicon has an impurity added thereto. A second layer of polysilicon is deposited above the first layer of polysilicon. The second layer of polysilicon has substantially less impurity added thereto, and in a preferred form, has no impurity added thereto. A third layer of polysilicon also having an impurity added thereto is deposited above the second layer of polysilicon. The third and second layers of polysilicon are etched away by a predetermined chemical reaction wherein an endpoint is detected by monitoring photoemissions provided from the reaction. The first layer of polysilicon is maintained. A layer of a second metal is formed above the first layer of polysilicon substantially above the contact fill region to provide electrical connectivity with the semiconductor contact.

These and other objects, features and advantages will be more clearly understood from the following detailed description taken in conjunction with the accompanying drawings.

DETAILED DESCRIPTION OF THE INVENTION

Figure 1A:
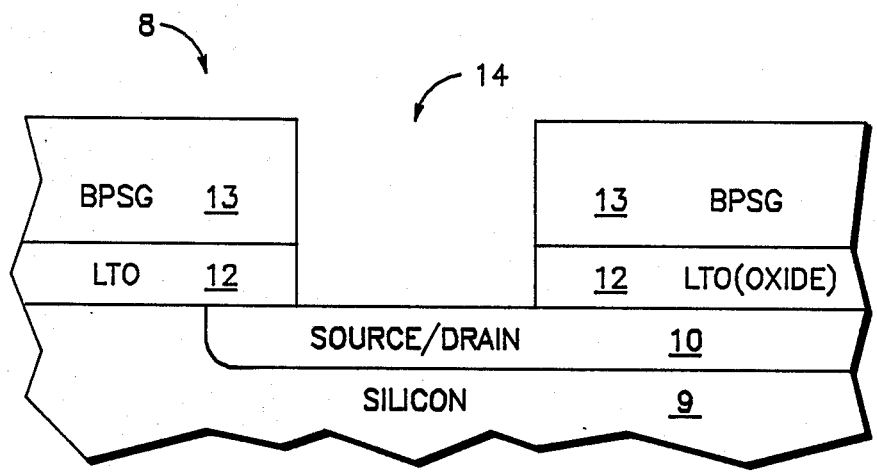
FIGS. 1(A)-(E) illustrate in cross-sectional diagram form the fabrication of a polysilicon contact in accordance with the present invention.

Shown in FIG. 1(A) is a cross-sectional view of a semiconductor structure 8 having a silicon substrate 9. In or on the silicon substrate 9 may be formed integrated circuit components. In the illustrated form, a source/drain diffusion 10 made of doped silicon is formed in substrate 9. Diffusion 10 may be either N+ or P+ conductivity. Other integrated circuit components on or in substrate 9 to be contacted may also be comprised of monocrystalline or polycrystalline silicon which may be undoped, P— or N—conductivity type. Also materials such as pure refractory metals, various metal silicides, nitrides, borides, etc. may be utilized to form components on or in substrate 9. On top of the diffusion and a portion of silicon substrate 9 is grown a layer of low temperature oxide (LTO) material 12. A layer of borophosphosilicate glass (BPSG) 13 is formed on the LTO material 12. In the illustrated form, a contact fill region 14 of a predetermined width has been formed by cutting straight wall contacts into the BPSG 13 and LTO material 12 to the top surface of silicon substrate 9. Contact fill region 14 may be formed by any one of several conventional techniques such as reactive ion etching (RIE) in a CHF$_3$ oxygen plasma.

Figure 1B:
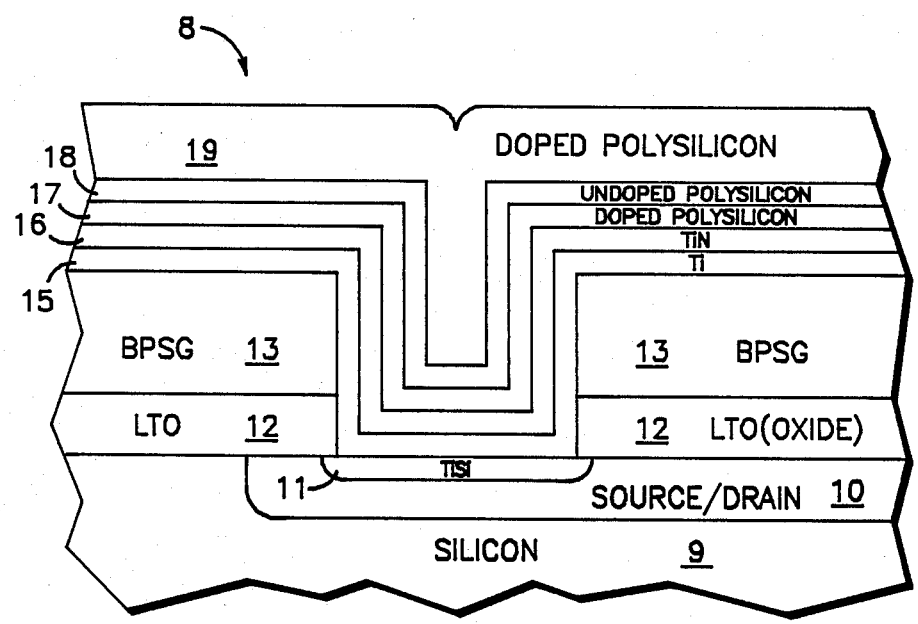

Shown in FIG. 1(B) is a cross-sectional view of semiconductor structure 8 after successive formation of the layers used in filling the contact fill region 14. Firstly, a planar layer of refractory metal 15 is deposited, typically by sputtering, over the entire top surface of structure 8 including contact fill region 14. In one form, titanium may be used as the refractory metal. Metal layer 15 should be of a metal which has good contact resistance to silicon and which is refractory so that the metal can withstand high temperature during subsequent annealing in the described process. Other metals may be used such as tungsten or titanium tungsten, an alloy of titanium and tungsten. The surfaces of the BPSG 13 and diffusion 10 are precleaned in a conventional manner to reduce the amount of native oxide on silicon diffusion 10 in order to minimize contact resistance. In one implementation, dilute HF mixed with phosphoric acid may be used as a cleansing solution. The metal layer 15 only has to be deposited to a thickness sufficient to react with the silicon of diffusion 10. A deposition thickness of two hundred angstroms is a generally sufficient thickness to insure good contact resistance to diffusion 10. A metal barrier 16 is then formed over the entire top surface of metal layer 15. In a preferred form, metal barrier 16 is a titanium nitride, TiN, barrier. The titanium nitride may be formed by any one of several methods. Metal layer 15 may be sputtered as pure titanium directly on top of contact fill region 14 and then annealed in nitrogen or ammonia to form titanium nitride (metal barrier 16). In one form, the titanium metal layer 15 may be formed with a thickness of between 500 to 2,000 angstroms depending upon the desired size of the contact region. However, other thicknesses of titanium may be used depending upon the process application. After sputtering the titanium metal layer 15 onto the BPSG 13 and diffusion 10, semiconductor structure 8 may be annealed in a rapid thermal annealer in a nitrogen ambient at approximately 650 degrees Centigrade for approximately fifteen seconds. It should be noted that other ambients such as an ammonia ambient may be utilized and much flexibility exists in the anneal time and temperature range. At this point a titanium silicide region 11 has been formed in the diffusion 10 which insures low contact resistance between the titanium and silicon layers. Metal barrier 16 may also be formed by reactively sputtering titanium in a nitrogen ambient. Yet another method for forming metal barrier 16 in semiconductor structure 8 is to deposit titanium nitride using chemical vapor deposition (CVD).

Above the titanium nitride metal barrier 16 a layer of insitu doped polysilicon 17 is deposited by using a conventional polysilicon tube. In one form, metal layer 16 is one thousand angstroms thick. After approximately one thousand anstroms of insitu doped polysilicon is deposited, a dopant gas species, such as phosphine (PH3), is turned off. A layer of undoped polysilicon 18 is then deposited to a depth of approximately one thousand angstroms. At this point, the dopant gases are turned back on and approximately seven thousand angstroms of doped polysilicon are deposited as insitu-doped for form doped polysilicon layer 19. A deposition temperature of no lower than 580 degrees Centigrade is necessary to guarantee that the deposited silicon is polycrystalline in nature and not amorphous. Since the bulk resistivity of polycrystalline silicon is five to six orders of magnitude lower than amorphous silicon, the insitu doped polycrystalline silicon forms a good conductor in the contact fill region 14. It is not critical whether the polysilicon is doped n— or p— type. In addition to Group III or Group IV dopants, other impurities such as oxygen, nitrogen, or carbon can be utilized. In a CMOS technology, contacts need to be made in both n+ and p+ silicon substrates. Therefore, it is necessary to separate the doped polysilicon layer 17 from the diffusion 10 by th e titanium nitride metal barrier 16 to prevent the formation of p-n or n-p diodes. The top surface of the layer of doped polysilicon 19 may have a slight depression immediately above the contact fill region. In a preferred form, layers 17 and 18 are each formed to a depth of approximately one thousand angstroms and layer 19 is formed to a depth of approximately seven thousand angstroms. The layering of the three tiered polysilicon layers 17, 18 and 19 is a straightforward process in which the thicknesses are accurately controllable. However, the exact thicknesses of polysilicon layers 17, 18 and 19 are not a critical aspect of the present invention. For very small contact geometries, the thickness or depth of doped polysilicon layer 19 need not be as thick in relation to layers 17 and 18 as shown in FIG. 1(B).

Another variation of the multi-layered polysilicon approach illustrated in FIG. 1(B) is to deposit only two layers of polysilicon. As described above, a first layer of polysilicon is insitu doped to a depth of approximately one thousande angstroms. However, another single layer of approximately eight thousand angstroms of undoped polysilicon is deposited. The advantage of this alternate technique is higher throughput in a polysilicon furnace due to a higher deposition rate of undoped polysilicon compared to insitu doped polysilicon. A disadvantage is higher contact resistance due to the high bulk resistivity of the undoped polysilicon.

Figure 1C:
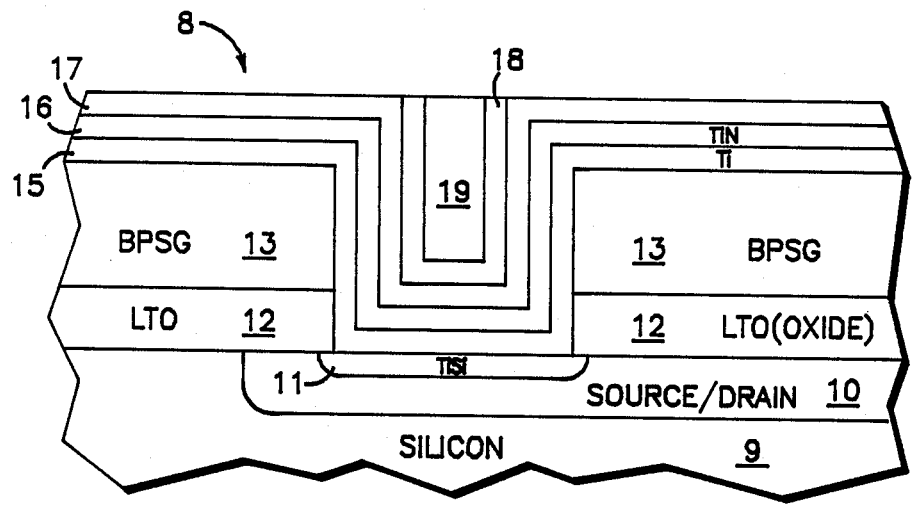

Shown in FIG. 1(C) is a cross-sectional view of semiconductor structure 10 after a selective endpoint etchback of layers 18 and 19 is performed. Semiconductor structure 10 is placed in a conventional etching systsem such as a parallel plate etcher. In the illustrated form, etchant gases are used to perform a blanket etchback of the polysilicon layers 19, 18 and 17. The primary etchant is a fluorine containing species, such as SF$_6$, which reacts with polysilicon to form volatile fluorides of silicon as follows:

$$SF_m + Si \rightarrow SiF_n + \text{Volatile Sulfur Compounds} \quad (1)$$

where "m" is an integer between one and six inclusive, and "n" is an integer between one and four inclusive. The optical emissons from the plasma is filtered so that only the wavelengths associated with the SiF$_n$ species reaches a photodetector. Because the undoped polysilicon is less conductive than the doped polysilicon, the SF$_6$ plasma reacts more slowly when it reaches the undoped polysilicon layer 18. As the reaction slows down, the SiFn emissons decrease. At the minimum point of the photoemission signal, the etchant plasma has reached the approximate midpoint of the layer 18. A short timed overetch can then be used to remove the remaining undoped polysilicon so that only the doped polysilicon layer 17 is left over the horizontal surfaces of metal barrier layer 16 as shown in FIG. 1(C). In order to amplify the early endpoint signal, a second etchant gas can be added to the etch plasma. This gas is preferably a chlorinated freon compound, such as CFCl$_3$. In the plasma, this gas dissociates into subfluorides and subchlorides of carbon, which react with the polysilicon to form volatile subfluorides and subchlorides of silicon as follows:

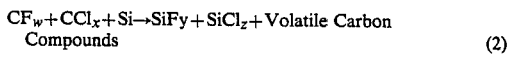

$$CF_w + CCl_x + Si \rightarrow SiF_y + SiCl_z + \text{Volatile Carbon Compounds} \quad (2)$$

where w, x, y, and z are integers between one and four, inclusive. The optical emissions from the plasma is sent throught a second filter so that only the wavelengths associated with the CCl$_x$ species reaches a second photodetector. As previously described, the reaction of equation two will also slow down when the etch plasma reaches the undoped polysilicon layer 18. In this case, however, the emission from the reactant CCl$_x$ increases and reaches a maximum at the appropriate midpoint of layer 18. By ratioing these two divergent emission signals VSiF$_n$/VCCl$_x$, the amplitude of the early endpoint signal can be significantly amplified. Therefore, the ratio of fluorine to chlorine emissions is magnified when etching between doped and undoped polysilicon layers and specific etch points between differing doped layers can be easily and accurately detected. This doping sensitive technique can also apply to a technique which is a chlorine based etch chemistry.

If all the polysilicon above the titanium nitride metal barrier 16 is removed so that polysilicon is only left in the contact fill area, many problems may result. The titanium nitride metal barrier 16 etches very slowly in the above described chemical reactions. As a result, a very large amount of reactant exists after the top surface of polysilicon is etched away. The excessive amount of reactant dramatically increases the etch rate of the polysilicon remaining in the contact fill area. Therefore, the polysilicon in the contact fill area may be quickly etched away thereby destroying the contact. This phenomena is conventionally known as the "loading" effect. A known solution prior to this invention for avoiding loading effects is to change the etch chemistry so that polysilicon is etched at the same rate as the titanium nitride. However, the etch process is significantly slowed and complicated as a result and this known alternative is not manufacturably practical. The present invention completely avoids loading effects and the associated problems.

As illustrated in FIG. 1(C), a thin layer of polysilicon 17 remains after the closely monitored blanket etchback. In a preferred form, a layer of no more than 1,000 angstroms of polysilicon should remain. Typically, a layer thickness in the range of 300 to 800 angstroms provides a sufficient layer to prevent loading effects. By utilizing a selective endpoint in the etchback process to leave polysilicon layer 17, all loading effects are eliminated.

Figure 1D:
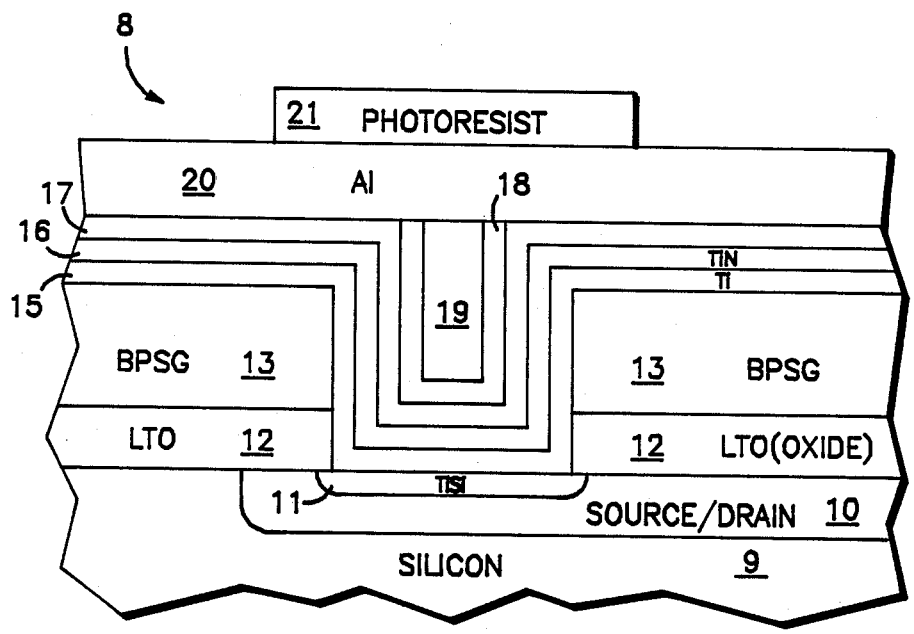

Shown in FIG. 1(D) is a cross sectional view of semiconductor structure 10 after a layer of aluminum 20 is sputtered or otherwise deposited over the polysilicon layer 17. Since the polysilicon layer 17 has a planar top surface, other types of deposition techniques having additional disadvantages associated therewith may be completely avoided. Before the sputtering of metal occurs, polysilicon layer 17 is pre-cleaned. A wet preclean is avoided to avoid any potential undercutting or attacking of the titanium nitride metal barrier 16 in case any titanium nitride might inadvertently be exposed anywhere on the semiconductor wafer. Preferably, a conventional insitu RF clean in a conventional sputtering machine is utilized. In a preferred form, the aluminum layer 20 is sputtered to a depth in the range of 6,000 to 8,000 angstroms although it should be readily noted that other deposition thicknesses may be preferable depending upon a specific application. The aluminum layer 20 above the contact fill area is then patterned with photoresist 21 in a conventional manner.

Figure 1E:
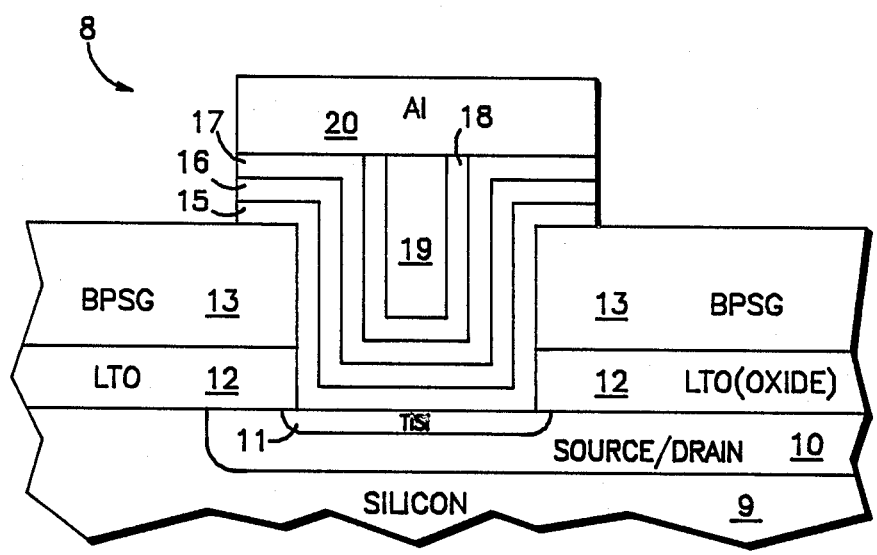

Shown in FIG. 1(E) is a cross sectional view of the completed semiconductor structure 10. Semiconductor structure 10 is now a multilayered structure which has been etched. The portion of aluminum layer 20, polysilicon layer 17, titanium nitride metal barrier 16 and titanium metal layer 15 which is not blocked by photoresist material 21 is etched away to provide the structure illustrated in FIG. 1(E). In one form, a chlorine based etch chemistry with conventional equipment may be used to perform the etch.

It should be noted that other variations of the invention may be readily made with respect to the thicknesses and doping of polysilicon layers 17, 18 and 19. Also, only a two polysilicon layer structure may be utilized wherein a doped layer is initially deposited and a thick undoped layer is deposited over the doped layer. In a two layer application, the blanket etch step would stop as soon as the chemical reaction indicated a change in photoemission levels at the doped/undoped interface. Further, the metal layers 15 and 20 may be comprised of the same metal although two different metals are illustrated. For example, layers 15 and 20 may both be formed of tungsten.

By now it should be apparent that a semiconductor process for providing a contact has been provided. The process utilizes varying layers of polysilicon and an early endpoint in the etching of polysilicon which is deposited in the contact fill region. A blanket barrier between the semiconductor substrate and the polysilicon of the contact, as opposed to a barrier only in the contact fill region, minimizes contact resistance and avoids critically high resistance interfaces in the contact region. The contact process taught herein is particularly well suited for micron and smaller VLSI technologies. The only resistively critical interface in semiconductor structure 10 occurs between the titanium silicide layer 11 and the N+ or P+ diffusion 10, and due to the properties of titanium silicide this interface has inherently low contact resistance. The titanium nitride metal barrier 16 functions as an excellent barrier to prevent cross-contamination between polysilicon and source/drain diffusion 11.

While the invention has been described in the context of a preferred embodiment, it will be apparent to those skilled in the art that the present invention may be modified in numerous ways and may assume many embodiments other than that specifically set out and described above. Accordingly, it is intended by the appended claims to cover all modifications of the invention which fall within the true spirit and scope of the invention.

We claim:

1. A method of forming a layered polysilicon contact, comprising the steps of:
   providing a substrate material with a doped diffusion region in a portion of the substrate material and at a top surface of the substrate material;
   depositing a layer of electrically insulating material above the substrate material and doped diffusion region;
   forming a contact fill region with substantially vertical sidewalls by removing a portion of insulating material to expose a portion of a top surface of the doped diffusion region;
   forming a first layer of a first metal over both the layer of electrically insulating material and the top surface of the doped diffusion region;
   forming a layer of a metal barrier material over the layer of first metal;
   depositing a first layer of polysilicon having an impurity added thereto above the layer of metal barrier material;
   depositing a second layer of polysilicon having substantially less impurity added thereto above the first layer of polysilicon;
   depositing a third layer of polysilicon having the impurity added thereto above the second layer of polysilicon;
   etching away the second and third layers of polysilicon and maintaining the first layer of polysilicon; and
   forming a second layer of a second metal above the first layer of polysilicon substantially above the contact fill region.

2. The method of claim 1 wherein the first layer of polysilicon is maintained after etching away the second and third layers of polysilicon by monitoring photoemissions provided from a chemical reaction used to etch the second and third layers of polysilicon.

3. The method of claim 1 wherein the metal barrier material is titanium nitride.

4. The method of claim 1 wherein the layer of electrically insulating material is dual layer comprising a layer of borophosphosilicate glass formed over a layer of undoped oxide.

5. The method of claim 1 wherein the third layer of polysilicon is deposited to a substantially larger thickness than the first and second layers of polysilicon.

6. The method of claim 1 wherein the first and second metals are the same metal material.

7. A method of forming a polysilicon contact, comprising the steps of:
   providing a silicon substrate having a diffusion region contained therein and extending along a portion of a top surface of the substrate, said contact to provide electrical connectivity to the diffusion region;
   depositing a layer of electrically insulating material above the substrate and diffusion region;
   forming a contact fill region by removing a portion of the layer of electrically insulating material to expose a portion of a top surface of the substrate;
   depositing a layer of a first metal over both the electrically insulating material and the exposed top surface of the substrate;
   forming a layer of titanium nitride over the layer of metal; depositing polysilion above the layer of titanium nitride to completely fill said contact fill region, said polysilicon having at least two zones of differing impurity concentrations;
   selectively etching by a predetermined chemical reaction each of the at least two zones of polysilicon until etching to an endpoint indicating a zone of polysilicon immediately above the layer of titanium nitride adjacent the contact fill region, said endpoint being detected by monitoring a ratio of a product produced from the predetermined reaction and a reactant used in the predetermined reaction and detecting a variation in the ratio when said endpoint is reached; and
   forming a layer of a second metal above the polysilicon which is not etched and substantially above the contact fill region.

8. The method of claim 7 wherein the layer of electrically insulating material is a dual layer of borophosphosilicate glass over a layer of undoped oxide.

9. The method of claim 7 wherein the ratio is a ratio of a chemical compound containing fluorine and a chemical compound containing chlorine.

10. The method of claim 7 wherein the first and second metals are the same metal material.

* * * * *